United States Patent
Onishi

(10) Patent No.: US 7,809,041 B2
(45) Date of Patent: Oct. 5, 2010

(54) SURFACE EMITTING SEMICONDUCTOR LASER

(75) Inventor: Yutaka Onishi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 70 days.

(21) Appl. No.: 12/149,605

(22) Filed: May 5, 2008

(65) Prior Publication Data

US 2008/0285612 A1   Nov. 20, 2008

(30) Foreign Application Priority Data

May 14, 2007   (JP) ............................ P2007-128403

(51) Int. Cl.
*H01S 5/00* (2006.01)
(52) U.S. Cl. ................. 372/50.11; 372/46.01
(58) Field of Classification Search .............. 372/50.11, 372/46.01
See application file for complete search history.

(56) References Cited

U.S. PATENT DOCUMENTS 5,459,746 A * 10/1995 Itaya et al. ............... 372/50.11
6,813,293 B2 * 11/2004 Johnson et al. ......... 372/46.015
6,888,873 B2 * 5/2005 Kwon ........................... 372/96
2006/0193361 A1 * 8/2006 Casimirus et al. ............. 372/68
2007/0258501 A1 * 11/2007 Chirovsky ............... 372/50.11
2008/0144683 A1 * 6/2008 Nakahara et al. ......... 372/45.01

OTHER PUBLICATIONS

"High efficiency long wavelength VCSEL on InP grown by MOCVD", N. Nishiyama et al., Electronics Letters, vol. 39. No. 5, pp. 437-439, 2003.

* cited by examiner

Primary Examiner—Tod T Van Roy
(74) Attorney, Agent, or Firm—Smith, Gambrell & Russell, LLP

(57) ABSTRACT

In a surface emitting semiconductor laser, a first distributed Bragg reflector includes first and second semiconductor layers of a first conductive type. A second distributed Bragg reflector includes first and second portions. An active layer is provided on the first distributed Bragg reflector. The first distributed Bragg reflector, the active layer and the second distributed Bragg reflector are sequentially arranged in the direction of a predetermined axis. A III-V compound semiconductor region is provided on the first distributed Bragg reflector so as to surround the first portion of the second distributed Bragg reflector. A tunnel junction region with a mesa portion and a tunnel junction also is provided. Further, a second conductive type III-V compound semiconductor layer is provided between the active layer and the tunnel junction region.

9 Claims, 5 Drawing Sheets

SURFACE EMITTING SEMICONDUCTOR LASER

BACKGROUND OF THE INVENTION

1. Field of the Invention

The present invention relates to a surface emitting semiconductor laser.

2. Related Background Art

Non-Patent Document (N. Nishiyama et al., Electronics Letters, vol. 39, no. 5, pp. 437-439, 2003) discloses a buried tunnel junction surface emitting laser. In the surface emitting laser, an AlInGaAs/InP distributed Bragg reflector (DBR), an active layer, an n-type InP layer for burying a tunnel junction, and a dielectric distributed Bragg reflector (DBR) are provided on an InP substrate. The dielectric distributed Bragg reflector is made of a-Si/$Al_2O_3$ and is provided on the n-type InP layer.

SUMMARY OF THE INVENTION

In the surface emitting semiconductor laser described in Non-Patent Document, an upper DBR made of dielectric is provided on the above InP semiconductor layer in order to form an optical cavity. The optical cavity defines the transverse mode of the laser beam, and active modes of the laser beam are controlled by a refractive index difference between the tunnel mesa having a tunnel junction and the periphery semiconductor that surrounds the tunnel mesa. The mesa size of the tunnel junction is reduced to a value as small as approximately 5 micrometers (μm) because a tunnel junction having a larger mesa size cannot provide a sufficient gain difference between the fundamental mode and high order modes. Therefore, in order to differentiate the gain for the fundamental mode from the high order modes, the mesa size, i.e., current injection size, of the tunnel junction cannot be enlarged. Since current is applied to the surface emitting semiconductor laser and flows through the tunnel junction, the cross sectional area of the tunnel junction cannot be also made large. The area of the cross section restricts an amount of the current that can be applied to the device, and thus this size limits the optical power of the fundamental mode.

It is an object of the present invention is to provide a surface emitting semiconductor laser which enables a sufficient gain difference between the fundamental mode and high order modes.

According to one aspect of the present invention, there is provided a surface emitting semiconductor laser. The surface emitting semiconductor laser comprises a first distributed Bragg reflector, a second distributed Bragg reflector, an active layer and a III-V compound semiconductor region. The first distributed Bragg reflector includes first and second semiconductor layers of a first conductive type, and the first and second semiconductor layers are alternately arranged. The second distributed Bragg reflector includes first and second portions, and the first and second portions are arranged in a direction of a predetermined axis. The first portion is made of semiconductor, and the second portion is made of dielectric. The active layer is provided on the first distributed Bragg reflector. The first portion of the second distributed Bragg reflector is provided between the second portion of the second distributed Bragg reflector and the active layer. The first distributed Bragg reflector, the active layer, and the second distributed Bragg reflector are sequentially arranged in the direction of the predetermined axis. The III-V compound semiconductor region is provided on the first distributed Bragg reflector to surround the first portion of the second distributed Bragg reflector.

The surface emitting semiconductor laser according to the present invention further comprises a tunnel junction region and a second conductive type III-V compound semiconductor layer. The tunnel junction region includes a mesa portion, and the III-V compound semiconductor region surrounds the mesa portion of the tunnel junction region. The tunnel junction region includes a tunnel junction, and the tunnel junction includes a first conductive type semiconductor layer and a second conductive type semiconductor layer. The second conductive type III-V compound semiconductor layer is provided between the active layer and the tunnel junction region, and the tunnel junction region is provided between the first portion of the second distributed Bragg reflector and the second conductive type III-V compound semiconductor layer.

In this surface emitting semiconductor laser, the III-V compound semiconductor region surrounds the tunnel junction region.

The surface emitting semiconductor laser according to the present invention further comprises a first electrode, and the first electrode is in contact with the III-V compound semiconductor region.

The surface emitting semiconductor laser according to the present invention further comprises a first conductive type III-V compound semiconductor layer. The first conductive type III-V compound semiconductor layer is provided between the mesa portion of the tunnel junction region and the first portion of the second distributed Bragg reflector.

In the surface emitting semiconductor laser according to the present invention, the III-V compound semiconductor region surrounds the first conductive type III-V compound semiconductor layer.

The surface emitting semiconductor laser according to the present invention further comprises an electrode provided on the III-V compound semiconductor region. The conductive type of the III-V compound semiconductor region is the same as that of the first portion of the second distributed Bragg reflector.

In the surface emitting semiconductor laser according to the present invention, the second portion of the second distributed Bragg reflector is provided on the first portion of the second distributed Bragg reflector and the III-V compound semiconductor region.

The surface emitting semiconductor laser according to the present invention further comprises a first electrode, and the first electrode is provided on the III-V compound semiconductor region.

The surface emitting semiconductor laser according to the present invention further comprises a semiconductor substrate, and the first distributed Bragg reflector, the active layer and the second distributed Bragg reflector are mounted on the semiconductor substrate.

BRIEF DESCRIPTION OF THE DRAWINGS

The above-described and other objects, features and advantages of the present invention will be more easily understood based on the following detailed description of preferred embodiments of the present invention with reference to the accompanied drawings.

DESCRIPTION OF THE PREFERRED EMBODIMENTS

Figure 1:
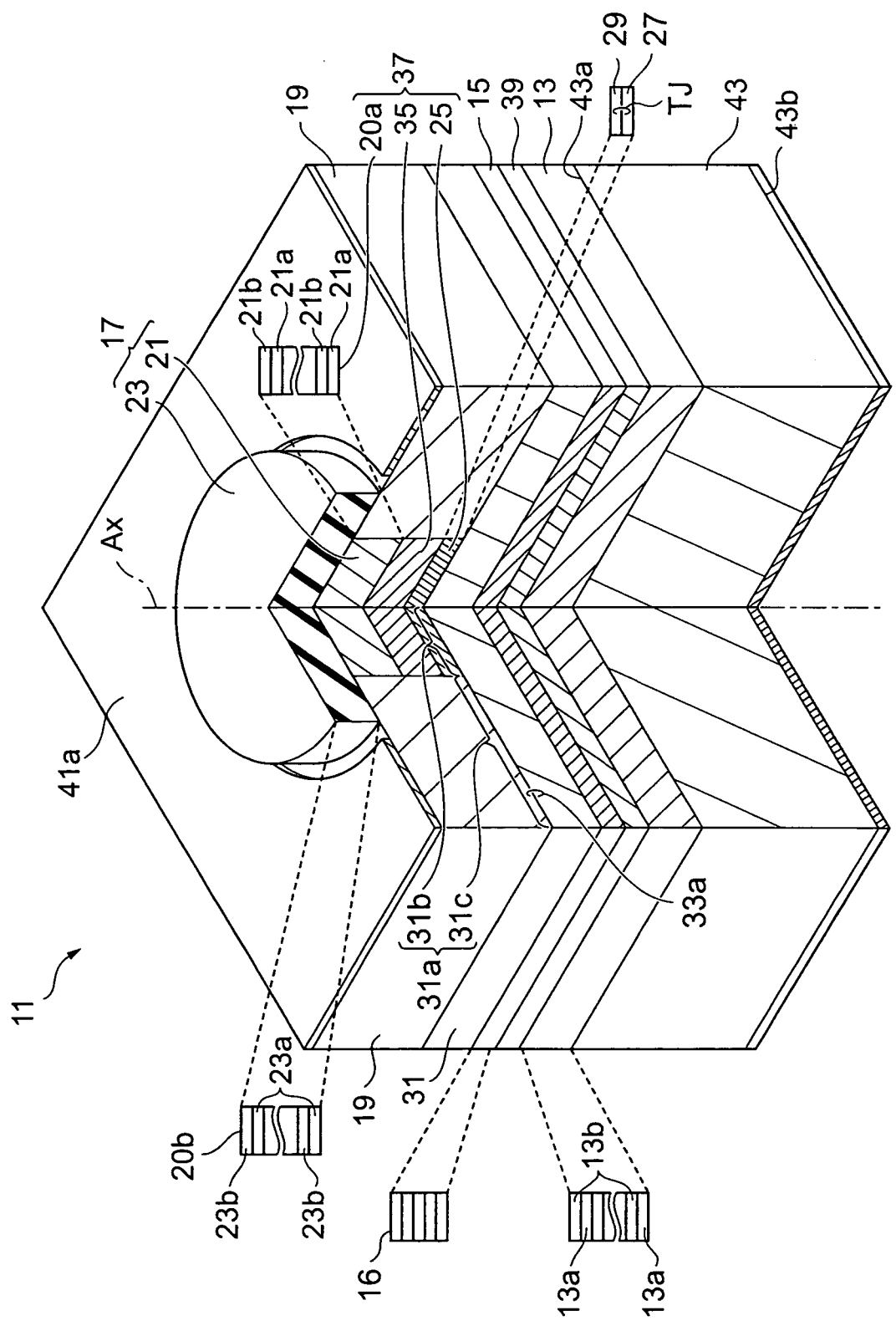
FIG. 1 is a schematic view showing the structure of a surface emitting semiconductor laser according to a preferred embodiment of the present invention.

FIG. 1 is a schematic view showing the structure of a surface emitting semiconductor laser according to a preferred embodiment of the present invention. A surface emitting semiconductor laser 11 comprises a first distributed Bragg reflector (hereinafter referred to as "first DBR") 13, an active layer 15, a second distributed Bragg reflector (hereinafter referred to as "second DBR") 17, and a III-V compound semiconductor region 19. The first DBR 13 includes first and second semiconductor layers 13a and 13b which are alternately arranged. The first DBR 13 and second DBR 17 form an optical cavity. The active layer 15 is provided on the first DBR 13. The second DBR 17 includes a first portion 21 and a second portion 23. The first and second portions 21, 23 are arranged in a direction of a predetermined axis "Ax." The III-V compound semiconductor region 19 is provided to surround the first portion 21 of the second DBR 17. The first portion 21 is provided between the second portion 23 and the active layer 15. In the second DBR 17, the first portion 21 includes a semiconductor laminate 20a, and the second portion 23 includes a dielectric laminate 20b. The first DBR 13, the active layer 15, and the second DBR 17 are arranged in the direction of the predetermined axis "Ax."

In this surface emitting semiconductor laser 11, since the III-V compound semiconductor region 19 surrounds the first portion 21, the distance between the first DBR 13 and the first portion 21 of the second DBR 17 is smaller than the distance between the first DBR 13 and the second portion 23 of the second DBR 17. This difference in distance enables the suppression of the higher order modes.

Further, in the surface emitting semiconductor laser 11, since the first portion 21 is formed in the III-V compound semiconductor region 19, the distance between the first DBR 13 and the second DBR 17 can be reduced. Furthermore, a part of the second DBR 17, i.e., first portion 21, is made of the semiconductor region 20a having a number of semiconductor layers, and both the semiconductor region 20a and the III-V compound semiconductor region 19 are provided with an electric conductivity. Therefore, the first portion 21 and the III-V compound semiconductor region 19 provide a path through which carriers flow to the active layer 15.

The semiconductor region 20a of the first portion 21 includes first and second semiconductor layers 21a and 21b. The first and second semiconductor layers 21a and 21b are alternately arranged. The dielectric region 20b of the second portion 23 includes first and second dielectric layers 23a and 23b, and the first and second dielectric layers 23a and 23b are alternately arranged.

The surface emitting semiconductor laser 11 further comprises a tunnel junction region 25 and a III-V compound semiconductor layer 31 of a second conductive type. The tunnel junction region 25 is provided between the first portion 21 of the second DBR 17 and the second conductive type III-V compound semiconductor layer 31. The tunnel junction region 25 may be shaped like a mesa. In the surface emitting semiconductor laser 11, the tunnel junction region 25 defines the electrical path that guides current. Further, the first portion 21 of the second DBR 17 is provided on the mesa portion of the tunnel junction region 25, and the III-V compound semiconductor region 19 is formed on the sides of the first portion 21 of the second DBR 17 and the mesa portion of the tunnel junction region 25. Accordingly, the top surface of the surface emitting semiconductor laser 11 does not have any step, which scatters light propagating in the optical cavity, formed by covering the top and side of the tunnel junction mesa with a spacer layer, so that the surface emitting semiconductor laser 11 is free from influence of optical scattering caused by such a step. In addition, the mesa portion of the tunnel junction region enables the confinement of current applied to the surface emitting semiconductor laser.

The tunnel junction region 25 comprises a semiconductor layer 27 of the second conductive type and a semiconductor layer 29 of a first conductive type, and the second conductive type semiconductor layer 27 and the first conductive type semiconductor layer 29 form the mesa portion. The second conductive type semiconductor layer 27 and the first conductive type semiconductor layer 29 are in contact with each other to form a tunnel junction TJ. The tunnel junction region 25 enables the conversion of a carrier type, i.e., conversion from one of electrons and holes to the other.

The second conductive type III-V compound semiconductor layer 31 is provided on the active layer 15. The primary surface 31a of the second conductive type III-V compound semiconductor layer 31 has a first area 31b and a second area 31c, and the second area 31c surrounds the first area 31b. The tunnel junction region 25 is located on the first area 31b, and the III-V compound semiconductor region 19 is located on the second area 31c. As shown in Part (b) of FIG. 3, the second conductive type III-V compound semiconductor layer 31 forms a pn junction 33a with the III-V compound semiconductor region 19, and the III-V compound semiconductor region 19 forms a pn junction 33b with the second conductive type semiconductor layer 27. When a forward voltage is applied to the surface emitting semiconductor laser 11, the pn junctions 33a and 33b are reversely biased. Thus, the carriers cannot flow through the pn junctions 33a and 33b, and are supplied from the III-V compound semiconductor region 19 and the first portion 21 through the tunnel junction TJ to the second conductive type III-V compound semiconductor layer 31. The tunnel junction region 25 can provide the carrier conversion and current confinement.

The surface emitting semiconductor laser 11 further comprise a III-V compound semiconductor layer 35 of the first conductive type. The first conductive type III-V compound semiconductor layer 35 is provided between the tunnel junction region 25 and the first portion 21. The first conductive type III-V compound semiconductor layer 35 permits the adjustment of the distance between the first portion 21 of the second DBR 17 and the active layer 15. In addition, the first conductive type III-V compound semiconductor layer 35 also functions as a path for carriers.

In the surface emitting semiconductor laser 11, the semiconductor portion 20a and the tunnel junction region (mesa portion) 25 form a semiconductor mesa 37. The semiconductor mesa 37 further includes the III-V compound semiconductor layer 35 of the first conductive type. The semiconductor mesa 37 defines positions and shapes of the first portion 21 and tunnel junction region 25.

The surface emitting semiconductor layer 11 further comprise a III-V compound semiconductor layer 39 of the first conductive type. The first conductive type III-V compound semiconductor layer 39 is provided between the first DBR 13 and the active layer 15. The first conductive type III-V compound semiconductor layer 39 permits the adjustment of the distance between the first DBR 13 and the active layer 15. The first conductive type III-V compound semiconductor layer 39 also provides a path for the carriers. The active layer 15 has a quantum well structure 16 in which well layers and barrier layers are alternately arranged. The active layer 15 is provided between the second conductive type III-V compound semiconductor layer 31 and the first conductive type III-V compound semiconductor layer 39.

The surface emitting semiconductor laser 11 further comprises an electrode 41a provided on the III-V compound semiconductor region 19. Since the conductive type of the III-V compound semiconductor region 19 is the same as the conductive type of the semiconductor region 20a, carriers from the electrode 41a reaches the active layer 15 through the III-V compound semiconductor region 19 and the semiconductor region 20a. In addition, a second electrode 41b is formed on the backside 43b of a conductive substrate 43. The substrate 43 is made of, for example, a semiconductor of the first conductive type. The first DBR 13 and other semiconductor layers are mounted on the primary surface 43a of the substrate 43.

In the surface emitting semiconductor laser 11, the second portion 23 of the second DBR 17 is provided on the first portion 21 and III-V compound semiconductor region 19. This structure does not need to position the second portion 23 to the first portion 21 at very high accuracy in forming the second portion 23 thereon.

One example of surface emitting semiconductor lasers according to the present embodiment is a vertical cavity surface emitting laser (VCSEL) which comprises the following:
conductive substrate 43: n-type GaAs substrate,
first DBR 13: 32 pairs of silicon-doped GaAs/$Al_{0.9}Ga_{0.1}As$ layers,
third spacer layer (the first conductive type III-V compound semiconductor layer) 39: silicon-doped GaAs,
active layer 15: three periods of $In_{0.2}Ga_{0.8}As$/GaAs,
second spacer layer (the second conductive type III-V compound semiconductor layer) 31: carbon-doped GaAs,
the junction region 25 ($n^{++}/p^{++}$ tunnel junction): silicon-doped InGaAs/carbon-doped InGaAs,
first spacer layer (the first conductive type III-V compound semiconductor layer) 35: silicon-doped GaAs,
second DBR 17 (the first portion 21): eight pairs of silicon-doped GaAs/silicon-doped $Al_{0.7}Ga_{0.3}As$ layer,
second DBR 17 (the second portion 23): five pairs of $SiO_2$/$TiO_2$,
III-V compound semiconductor regions 19: silicon-doped GaAs.

Figure 2:
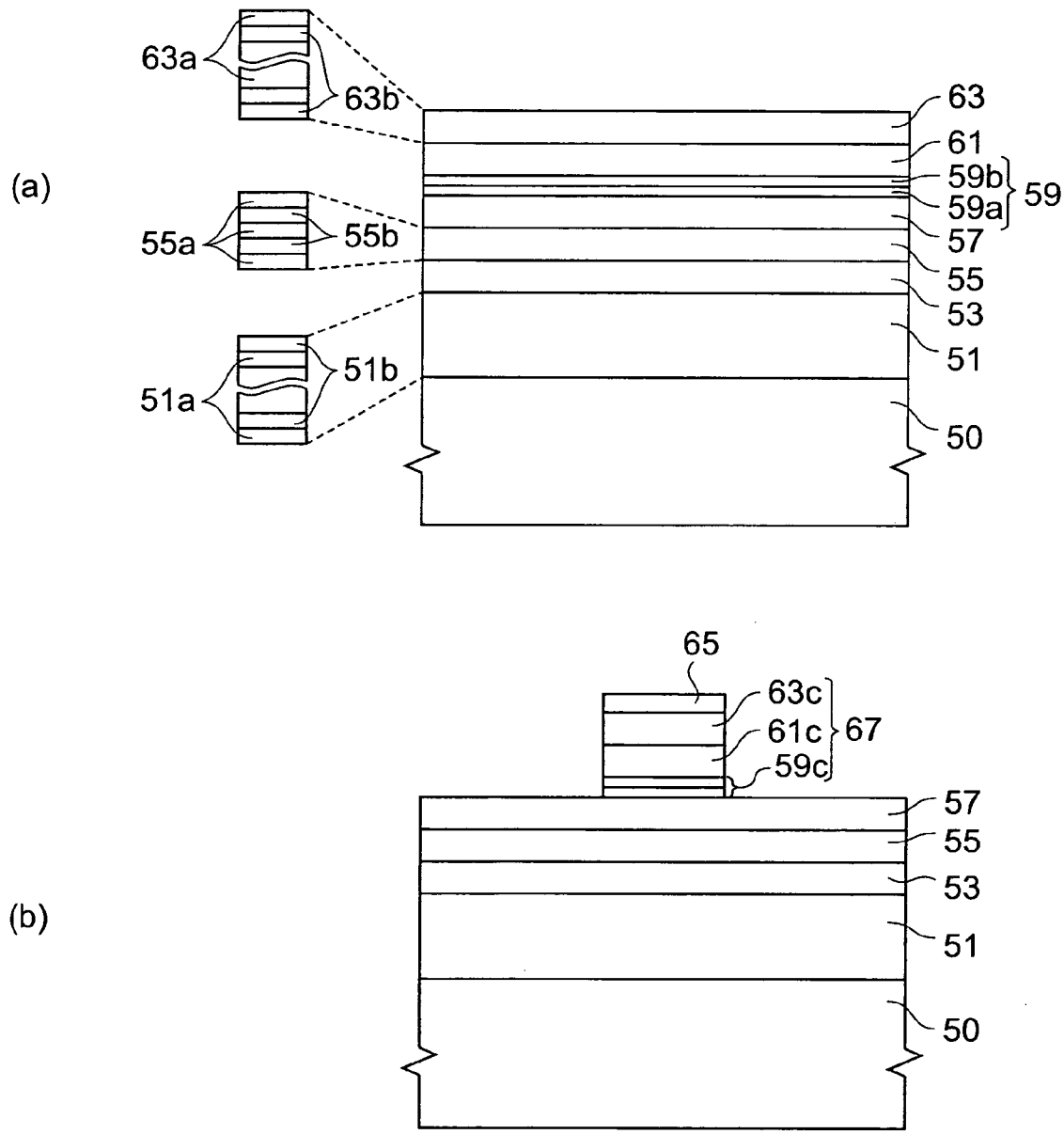
FIG. 2 is a diagram showing primary steps in the method of fabricating a surface emitting semiconductor laser according to the preferred embodiment of the present invention.
Figure 3:
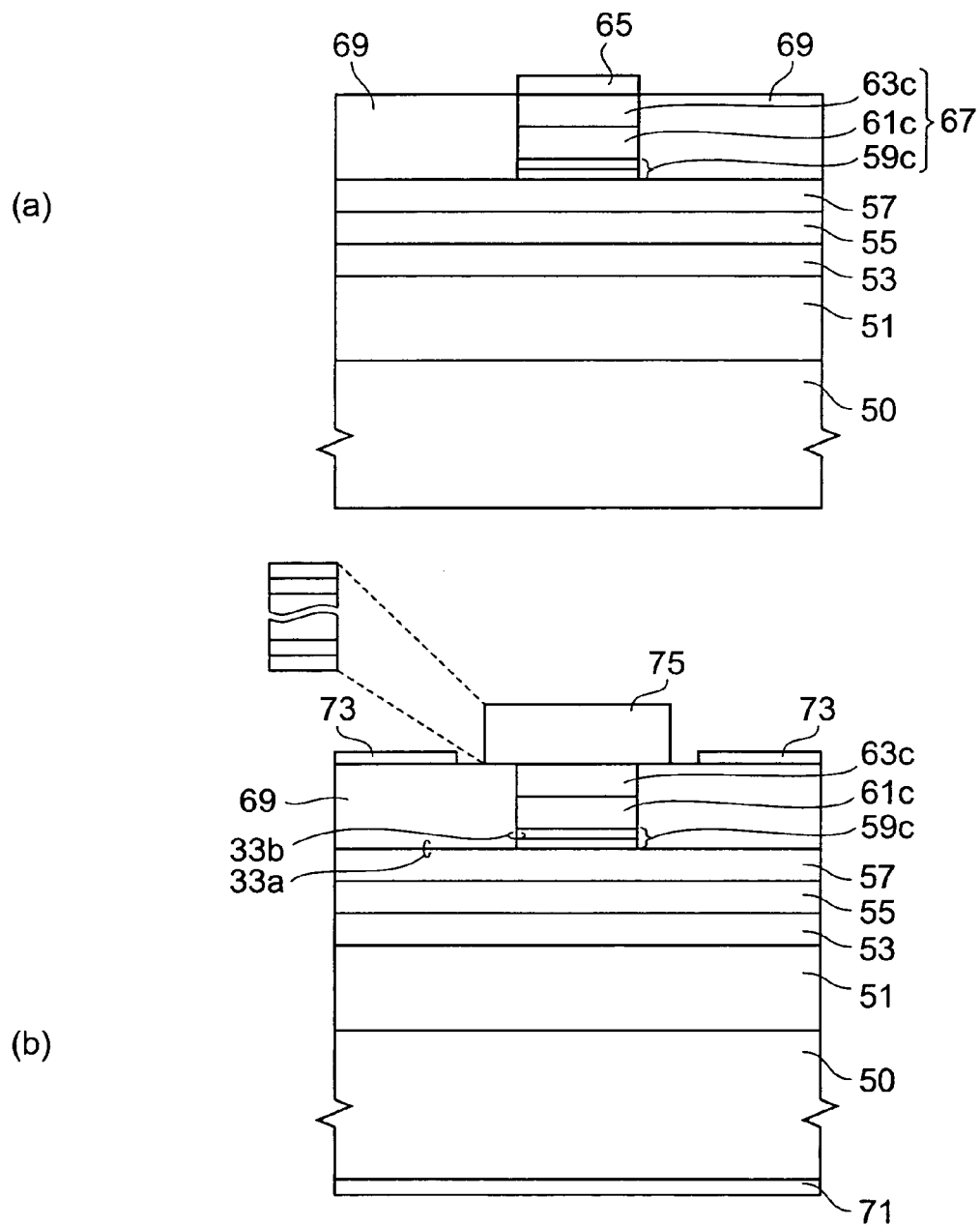
FIG. 3 is a diagram showing primary steps in the method of fabricating a surface emitting semiconductor laser according to the preferred embodiment of the present invention.

FIGS. 2 and 3 are diagrams showing primary steps in a method of fabricating a surface emitting semiconductor laser according to a preferred embodiment of the present invention. The fabrication will now be described with reference to FIGS. 2 and 3.

As shown in Part (a) in FIG. 2, a number of epitaxial semiconductor films for the surface emitting semiconductor laser is grown. First, a semiconductor laminate 51 for the first DBR, an n-type spacer layer 53, an active layer 55, a p-type spacer layer 57, and a heavily-doped p-type semiconductor film 59a and heavily-doped n-type semiconductor film 59b for the tunnel junction are formed, and, on the active layer 55, an n-type spacer layer 61 and a layered semiconductor film 63 for the distributed Bragg reflector are sequentially grown.

More specifically, an n-type GaAs substrate is placed in a reactor. The semiconductor laminate 51 including 32 pairs of GaAs/$Al_{0.9}Ga_{0.1}As$ is formed on the n-type GaAs substrate 50. The layered structure for the semiconductor laminate 51 is provided for a distributed Bragg reflector. The GaAs layer 51a and the $Al_{0.9}Ga_{0.1}As$ layer 51b are doped with silicon. Next, a Si-doped GaAs is grown for the n-type spacer layer 53. Then, the active layer 55 having a quantum well structure is formed thereon, and the active layer 55 includes GaAs layers 55a and $In_{0.2}Ga_{0.8}As$ layers 55b. Thereafter, carbon-doped GaAs is grown for the p-type spacer layer 57. A tunnel junction region 59 is formed on the p-type spacer layer 57. An InGaAs layer 59a and an InGaAs layer 59b are grown thereon for the tunnel junction region 59, and the InGaAs layer 59a is heavily doped with carbon and the InGaAs layer 59b is heavily doped with silicon. Si-doped GaAs is grown thereon for the n-type spacer layer 61. Then, the layered semiconductor 63 is formed to include eight pairs of GaAs/$Al_{0.7}Ga_{0.3}As$ layers, and this layered semiconductor 63 is provided for a distributed Bragg reflector. The GaAs layer 63a and the $Al_{0.7}Ga_{0.3}As$ layer 63b are doped with silicon. Metal organic vapor phase epitaxy can be used to grow these layers. After the above growth, an epitaxial wafer has been formed.

As shown in Part (b) of FIG. 2, the epitaxial wafer was taken out from the reactor, and a mask 65 is formed on the epitaxial wafer. The shape of the mask 65 is, for example, circular, and its diameter is, for example, 7 micrometers (μm). The mask 65 may be made of an insulating material, such as silicon oxide. The epitaxial wafer is dry-etched using the mask 65 to form a post having a shape of a circular cylinder (semiconductor mesa) 67. The post 67 includes a tunnel junction region 59c, an n-type spacer layer 61c, and a semiconductor laminate 63c.

After the above etching process, the etched wafer is processed for cleaning and is place in the reactor. As shown in Part (a) of FIG. 3, an n-type GaAs 69 is grown on the side of the post 67 so as to bury the post 67.

As shown in Part (b) of FIG. 3, a cathode electrode 71 is formed on an entire surface of the backside of the GaAs substrate 50, and an anode electrode 73 is formed on the surface of the n-type GaAs region 69. The anode electrode 73 is not formed on a part of this surface through which light from the active layer is emitted, and thus has an opening for light emission. The opening had a circular shape with, for example, a diameter of 20 micrometers (μm). After forming the anode electrode, a number of dielectric films are formed thereon and are processed, for example by lift-off method, to form a dielectric region 75 including five pairs of $TiO_2$/$SiO_2$. The shape of the dielectric region 75 is a circular cylinder, and its diameter is, for example, 15 micrometers (μm). After these steps, the structure "B" of the surface emitting semiconductor laser is obtained.

For comparison, a surface emitting semiconductor laser having another structure "C" is fabricated through the following steps. An n-type GaAs substrate is loaded to a reactor, and a semiconductor region is grown on the n-type GaAs substrate to include, for example, 32 pairs of Si-doped GaAs/$Al_{0.9}Ga_{0.1}As$. This semiconductor region is provided for a distributed Bragg reflector. Then, Si-doped GaAs is formed for an n-type spacer layer. Next, an active layer is formed thereon, and has a quantum well structure including a GaAs layer and an $In_{0.2}Ga_{0.8}As$ layer. Next, a carbon-doped GaAs is grown thereon for a p-type spacer layer. On the p-type spacer layer, InGaAs layers for a tunnel junction region are formed on the p-type spacer layer. One InGaAs layer is heavily doped with carbon, and the other InGaAs layer is heavily doped with silicon. After the above steps, an epitaxial wafer has been formed.

Then, this epitaxial wafer is taken out from the reactor, and a mask to form a mesa structure in the semiconductor region is formed on the epitaxial wafer. The shape of this mask is circular, and its diameter is, for example, 7 micrometers (μm). By use of the mask, the heavily carbon doped InGaAs layer and the heavily silicon doped InGaAs layer are etched to form a tunnel junction region of a mesa shape. Then, this wafer is cleaned and loaded to the reactor. An n-type GaAs spacer layer is grown over the top and side of the mesa to bury the mesa, so that the surface of the burying n-type GaAs spacer layer is uneven and has a thus-formed step associated with the buried mesa.

Next, after a cathode electrode is formed on the entire surface of the backside of the GaAs substrate, an anode electrode is formed on the surface of the n-type GaAs substrate and is not formed on a part of this surface through which light from the active layer is emitted. The anode electrode has an opening for this light emission. The shape of the opening is circle and its diameter is, for example, 20 micrometers (μm). After forming the anode electrode, a dielectric region of five pairs of $TiO_2/SiO_2$ is formed by use of lift-off method. The shape of the dielectric region is a circular cylinder, and its diameter is, for example, 15 micrometers (μm). After the above steps, the structure "C" for a surface emitting semiconductor laser is obtained.

In each of structure "B" and "C," current is injected into the active layer through the tunnel junction. In each structure, the tunnel junction is positioned at a node of electric field of light in the cavity to avoid optical absorption and minimizes optical loss. The active layer is positioned at an antinode of the electric field to maximize the optical gain.

Figure 4:
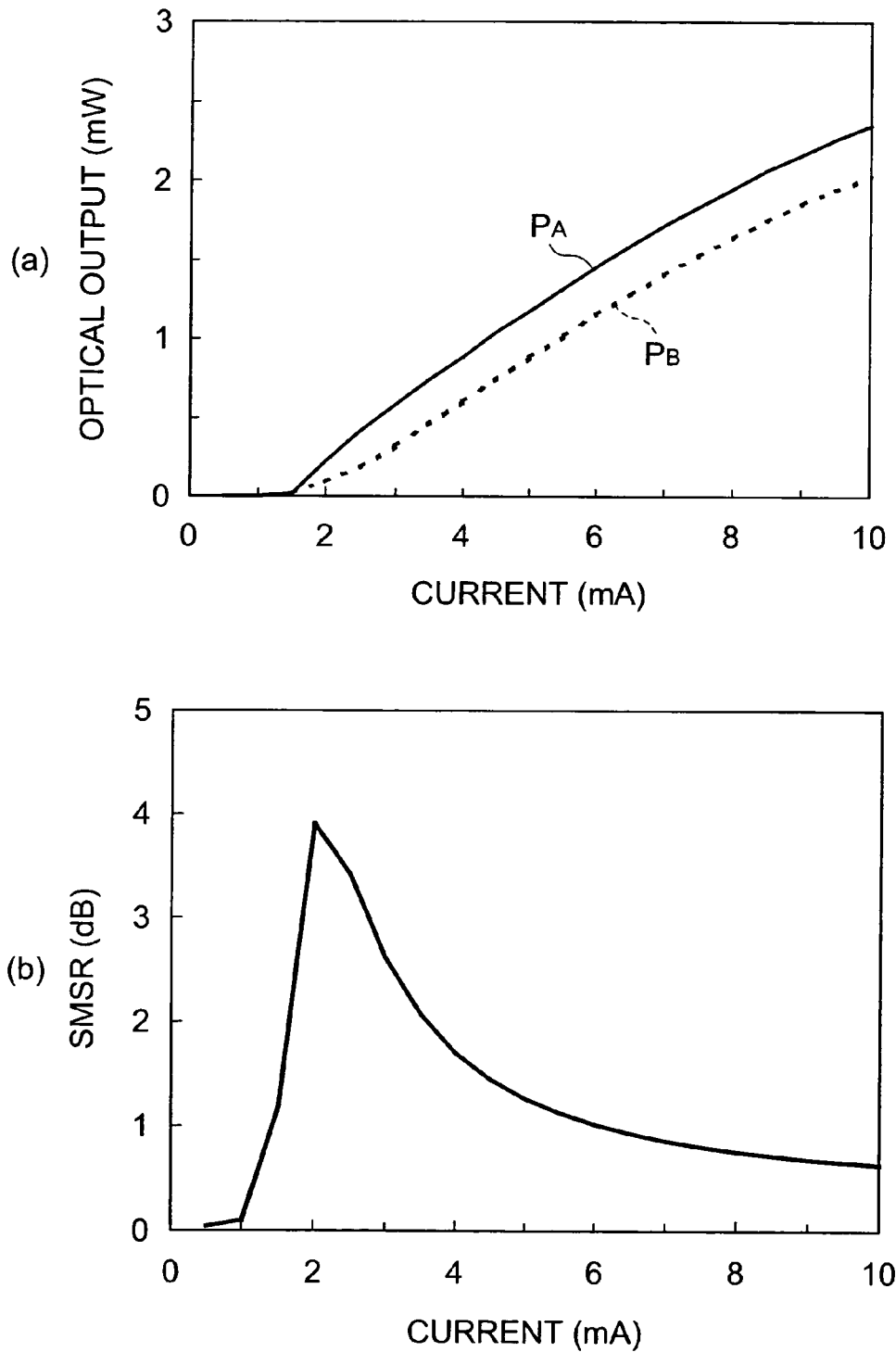
FIG. 4 is a diagram showing characteristics of the device of structure "C."

Part (a) of FIG. 4 is a diagram showing a relationship between optical power and current in the structure "C." Optical measurement of the structure "C" is conducted using spectral decomposition in order to separate the optical power of the fundamental mode from the optical power of other higher order modes. In Part (a) of FIG. 4, solid line "$P_A$" indicates an optical power of the fundamental mode and dotted line "$P_B$" indicates optical power of the higher order modes. It can be seen that the optical power of the fundamental mode is approximately 2 mW and that the higher order modes are activated at approximately the same optical power. Part (b) of FIG. 4 is a diagram showing a relationship between the sub-mode suppression ratio (SMSR) and current of the device in the structure "C." Since many higher order mode components are active, the SMSR is less than or equal to 4 dB.

The reason why the higher order modes are activated and the SMSR is made deteriorated is as follows. The current injection area (tunnel junction mesa size) is as large as seven micrometers (μm). Accordingly, the higher order modes are provided with relatively high gains, and the thresholds for lasing oscillation in these higher order modes are made low. In semiconductor lasers which have a flat DBR as described in the related art, the current injection size needs to be as small as approximately five micrometers (μm) in order to ensure the fundamental mode oscillation.

Figure 5:
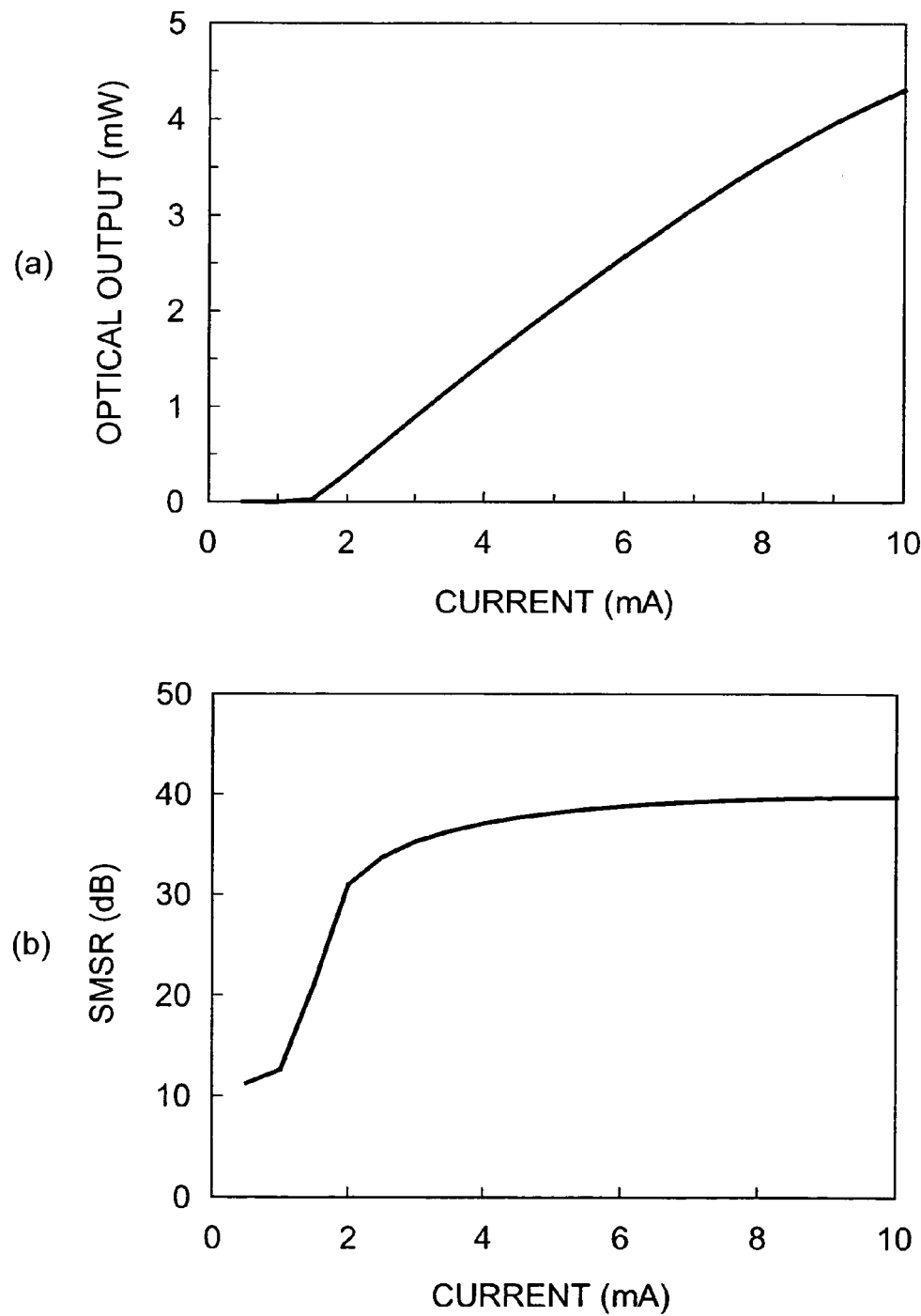
FIG. 5 is a diagram showing characteristics of the device of structure "B."

Part (a) of FIG. 5 is a diagram showing a relationship between an optical power and current in the structure "B." Optical measurement of the structure "B" is conducted through spectral decomposition in order to separate the optical power of the fundamental mode from the optical powers of other higher order modes. In Part (a) of FIG. 5, solid line "C" indicates the optical power of the fundamental mode. In this structure "B," only the fundamental mode is active. The optical power of the fundamental mode is approximately 4 mW and this value is twice as large as the optical power of the fundamental mode in the structure "C." Part (b) of FIG. 5 is a diagram showing a relationship between the sub-mode suppression ratio (SMSR) and current of the device in the structure "B." In the structure "B," the SMSR is greater than or equal to 30 dB in the application of current greater than or equal to the threshold value and therefore the structure B exhibits an excellent SMSR performance.

In the structure "B" of the present embodiment, since the fundamental mode has a peak in strength of the electric field on the center axis of the cylindrical post, the fundamental mode among all the transverse modes is most strongly reflected by the semiconductor DBR in the post portion. Since the semiconductor DBR of the upper DBR is contained in the post portion to form the primary optical cavity, the length of the primary cavity is made shorter than that of the outer optical cavity formed by the dielectric DBR of the upper DBR, so that the fundamental mode gain per unit time is made large to reduce the oscillation threshold value.

On the other hand, the electric field distribution of the higher order modes broadens as compared with that of the fundamental mode, and thus, in the semiconductor DBR, the reflection of the higher order modes in the post portion is weaker than that of the fundamental mode. The components of the higher order modes spreading to the outside of the post portion are mainly reflected by the dielectric DBR. The length of the outer optical cavity in which only the dielectric DBR reflects light is longer than that of the primary optical cavity in which the semiconductor and dielectric DBRs reflect light, so that the gain per unit time for the higher order modes is smaller than that of the fundamental mode, and the threshold of the higher order modes is made large.

As described above, in the structure "B" of the present embodiment, the difference in optical gain between the higher order modes and the fundamental mode can be made large. The higher order modes are not activated to achieve a stable oscillation in the fundamental mode even when the current injection size is enlarged. In addition, a large current injection size can be used to enhance the optical power of the fundamental mode.

The present structure also has the following advantage. Although current is applied thought an electrode located in the outside of the dielectric DBR, the electrons flow through sufficiently thick n-type semiconductor made of both the semiconductor post and the n-type semiconductor that buries the semiconductor post, so that the resistance of this device is not increased.

By adjusting the number of pairs of semiconductor layers in the semiconductor DBR, it is possible to adjust the effective cavity length for the higher order modes, and, consequently, provide the fundamental mode with a gain advantage compared with the higher order modes.

Moreover, since the second DBR includes the layered semiconductor in addition to the dielectric region, the heat dissipation can be improved while keeping the cavity length short, in other words, maintaining the structure that allows for high speed modulation. This is advantageous for high power lasers.

Furthermore, since the active layer is not subjected to etching process, the reliability is higher than buried heterostructure vertical cavity semiconductor lasers (VCSELs) that require etching process to form the active layer.

A surface emitting laser having the following structure is manufactured using an InP substrate in place of the GaAs substrate.

Another example of surface emitting semiconductor lasers according to the present embodiment is a vertical cavity surface emitting laser (VCSEL) which comprises the following: the conductive substrate 43: an n-type InP substrate, first DBR 13: 40 pairs of AlGaInAs/InP,
third spacer layer (the first conductive type III-V compound semiconductor layer) 39: silicon-doped AlInAs,
active layer 15: 5 periods of $Al_{0.06}Ga_{0.42}In_{0.52}As/Al_{0.16}Ga_{0.32}In_{0.52}As$,
second spacer layer (the second conductive type III-V compound semiconductor layer) 31: carbon-doped AlInAs,
junction region 25 ($n^{++}/p^{++}$ tunnel junction): silicon-doped AlGaInAs/carbon-doped AlGaInAs,
first spacer layer (the first conductive type III-V compound semiconductor layer) 35: silicon-doped InP,
second DBR 17 (the first portion 21): 8 pairs of silicon-doped AlGaInAs/silicon-doped InP,
second DBR 17 (the second portion 23): 5 pairs of $TiO_2/SiO_2$, and III-V compound semiconductor region 19: silicon-doped InP.

In this device, the fundamental mode power is significantly improved from 2 mW to 4 mW.

When a mesa with a tunnel junction region (hereinafter referred to as "TJ mesa") is buried by re-growth after the TJ mesa has been formed, a raised area which is associated with the shape of the buried TJ mesa is formed on the surface of the burying semiconductor. Since the dielectric DBR is formed over the step, light in the optical cavity is scattered by the large difference in indices of refraction around the edge of the raised area, which causes optical loss. However, in the structure of the present embodiment, the tunnel junction region is not buried alone but is buried together with the semiconductor post by semiconductor, so that the raised area that is associated with the shape of the tunnel junction region is not formed in the surface of the burying semiconductor.

The surface emitting semiconductor laser described in Non-Patent Document includes a semiconductor DBR and a dielectric DBR. Since the dielectric DBR is positioned around the center of the semiconductor region and current cannot flow through the dielectric DBR, the electrode is provided in an outer area of the surface of the semiconductor region so as to avoid the dielectric DBR. Carriers from the electrode are supplied to the active layer through the semiconductor region. Since the dielectric DBR is positioned around the center of the semiconductor region and carriers from the electrode flowing in a transverse direction within the semiconductor region to the active layer and contributing to light emission therein, the semiconductor region between the active layer and the dielectric DBR needs to have a sufficient thickness in order to increase an amount of carriers flowing in the transverse direction. But, when the thickness of the semiconductor region is made large, the distance between the semiconductor DBR and the dielectric DBR becomes long.

In the semiconductor laser of Non-Patent Document, an upper DBR is provided on a flat semiconductor region, and the transverse modes are controlled by a difference in indices of refraction between the tunnel junction and the surrounding region. However, when a sufficient gain difference cannot be provided for the fundamental mode compared to the higher order modes, the mesa size of the tunnel junction has to be reduced, for example, to approximately 5 micrometers (μm). Since current is injected through this small area, the maximum possible optical power of the fundamental mode is limited thereby. On the other hand, as described in the description of the surface emitting laser according to the present embodiment, the upper DBR comprises the dielectric DBR portion and the buried semiconductor DBR portion. This structure can provide a stable waveguiding property by use of index of refraction and increase the gain difference between the higher order modes and the fundamental mode, thereby achieving high optical power in the fundamental mode.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A surface emitting semiconductor laser comprising:
    a first distributed Bragg reflector including first and second semiconductor layers of a first conductive type, the first and second semiconductor layers being alternately arranged;
    a second distributed Bragg reflector including first and second portions, the first and second portions being arranged in a direction of a predetermined axis, the first portion being made of semiconductor, and the second portion being made of dielectric;
    an active layer provided on the first distributed Bragg reflector; the first portion of the second distributed Bragg reflector being provided between the active layer and the second portion of the second distributed Bragg reflector, and the first distributed Bragg reflector, the active layer, and the second distributed Bragg reflector being sequentially arranged in the direction of the predetermined axis;
    a III-V compound semiconductor region provided on the first distributed Bragg reflector to surround the first portion of the second distributed Bragg reflector;
    a tunnel junction region including a mesa portion with the III-V compound semiconductor region surrounding the mesa portion, the tunnel junction region including a tunnel junction with a first tunnel junction conductive type semiconductor layer and a second tunnel junction conductive type semiconductor layer; and
    a second conductive type III-V compound semiconductor layer provided between the active layer and the tunnel junction region, the tunnel junction region being provided between the first portion of the second distributed Bragg reflector and the second conductive type III-V compound semiconductor layer,
    wherein the III-V compound semiconductor region surrounds the tunnel junction region.

2. The surface emitting semiconductor laser according to claim 1, further comprising a first conductive type III-V compound semiconductor layer provided between the tunnel junction region and the first portion of the second distributed Bragg reflector.

3. The surface emitting semiconductor laser according to claim 2, wherein the III-V compound semiconductor region surrounds the first conductive type III-V compound semiconductor layer.

4. The surface emitting semiconductor laser according to claim 1, further comprising: an electrode provided on the III-V compound semiconductor region,
    wherein a conductive type of the III-V compound semiconductor region is the same as that of the first portion of the second distributed Bragg reflector.

5. The surface emitting semiconductor laser according to claim 1, wherein the second portion of the second distributed Bragg reflector is provided on the first portion of the second distributed Bragg reflector and the III-V compound semiconductor region.

6. The surface emitting semiconductor laser according to claim 5, further comprising a first electrode, wherein the first electrode is provided on the III-V compound semiconductor region.

7. The surface emitting semiconductor laser according to claim 1, further comprising a first electrode,
wherein the first electrode is in contact with the III-V compound semiconductor region.

8. The surface emitting semiconductor laser according to claim 1, further comprising a semiconductor substrate, the first distributed Bragg reflector, the active layer and the second distributed Bragg reflector being mounted on the semiconductor substrate.

9. The surface emitting semiconductor laser according to claim 1, wherein the first and second portions of the second distributed Bragg reflector have first and second diameters, respectively, said second diameter being larger than said first diameter, a primary optical cavity is composed of the first portion of the second distributed Bragg reflector, an outer optical cavity is composed of the second portion of the second distributed Bragg reflector, and a length of the primary optical cavity is shorter than a length of the outer optical cavity.

* * * * *